(12) United States Patent
Carcasi et al.

(10) Patent No.: US 9,519,227 B2
(45) Date of Patent: Dec. 13, 2016

(54) METROLOGY FOR MEASUREMENT OF PHOTOSENSITIZER CONCENTRATION WITHIN PHOTO-SENSITIZED CHEMICALLY-AMPLIFIED RESIST (PS-CAR)

(71) Applicant: TOKYO ELECTRON LIMITED, Tokyo (JP)

(72) Inventors: Michael A. Carcasi, Austin, TX (US); Mark H. Somervell, Austin, TX (US); Joshua S. Hooge, Austin, TX (US); Benjamen M. Rathsack, Austin, TX (US); Seiji Nagahara, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 191 days.

(21) Appl. No.: 14/628,682

(22) Filed: Feb. 23, 2015

(65) Prior Publication Data
US 2015/0241793 A1   Aug. 27, 2015

Related U.S. Application Data

(60) Provisional application No. 61/944,050, filed on Feb. 24, 2014.

(51) Int. Cl.
G03F 7/20 (2006.01)

(52) U.S. Cl.
CPC ......... *G03F 7/70608* (2013.01); *G03F 7/2022* (2013.01); *G03F 7/70633* (2013.01); *G03F 7/70675* (2013.01)

(58) Field of Classification Search
CPC   G03F 7/70608; G03F 7/2022; G03F 7/70633; G03F 7/70675
USPC .......................................... 430/30, 328, 394
See application file for complete search history.

(56) References Cited

U.S. PATENT DOCUMENTS

| 6,844,135 | B2 | 1/2005 | Kon et al. |
| 7,829,269 | B1 | 11/2010 | Fonseca et al. |
| 2010/0245790 | A1 | 9/2010 | Seltmann et al. |
| 2011/0177464 | A1 | 7/2011 | Takeda et al. |
| 2013/0084532 | A1 | 4/2013 | Wu et al. |
| 2013/0234294 | A1 | 9/2013 | Hu et al. |
| 2013/0260313 | A1 | 10/2013 | Allen et al. |

FOREIGN PATENT DOCUMENTS

| JP | 2007501431 A | 1/2007 |
| WO | 2013007442 A1 | 1/2013 |
| WO | 2005013007 A1 | 2/2015 |

OTHER PUBLICATIONS

International Searching Authority, Search Report and Written Opinion issued in related International Application PCT/US2015/017056, dated May 29, 2015, 10 pp.
International Searching Authority, Search Report and Written Opinion issued in corresponding International Application PCT/US2015/017071 dated May 29, 2015, 13 pp.
S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.
S. Tagawa, et al., "New Sensitization Method of Chemically Amplified EUV/EB Resists," presented at the 2013 International Symposium on EUV Lithography. Toyama, Japan Oct. 6-10, 2013.
A. Ravve, "Light-Associated Reactions of Synthetic Polymers", Springer Science-Business Media, ISBN 0387318038, pp. 23-25, 2006.
International Bureau of WIPO, International Preliminary Report on Patentability issued in related International Application No. PCT/US2015/017056 on Aug. 30, 2016, 7 pp.
International Bureau of WIPO, International Preliminary Report on Patentability issued in corresponding International Application No. PCT/US2015/017071 on Aug. 30, 2016, 10 pp.

*Primary Examiner* — Christopher Young
(74) *Attorney, Agent, or Firm* — Wood Herron & Evans LLP

(57) ABSTRACT

Methods for measuring photosensitizer concentrations in a photo-sensitized chemically-amplified resist (PS-CAR) patterning process are described. Measured photosensitizer concentrations can be used in feedback and feedforward control of the patterning process and subsequent processing steps. Also described is a metrology target formed using PS-CAR resist, and a substrate including a plurality of such metrology targets to facilitate patterning process control.

20 Claims, 3 Drawing Sheets

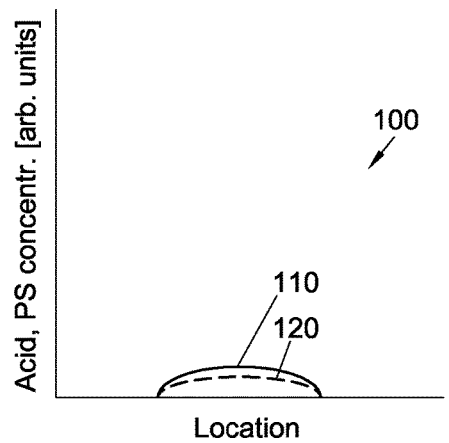
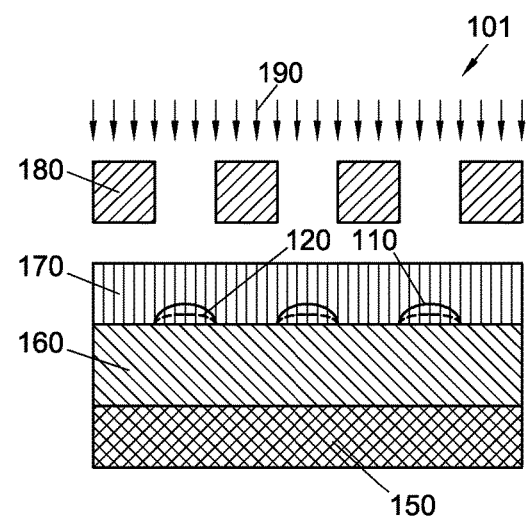
FIG. 1A  FIG. 1B
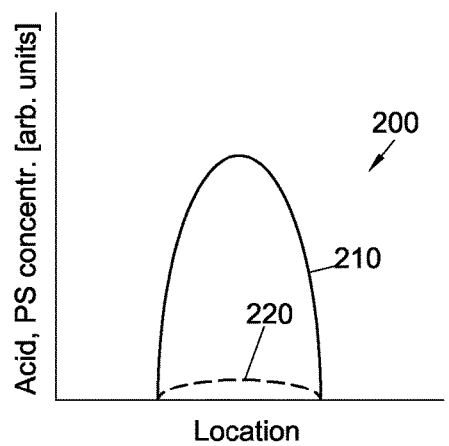
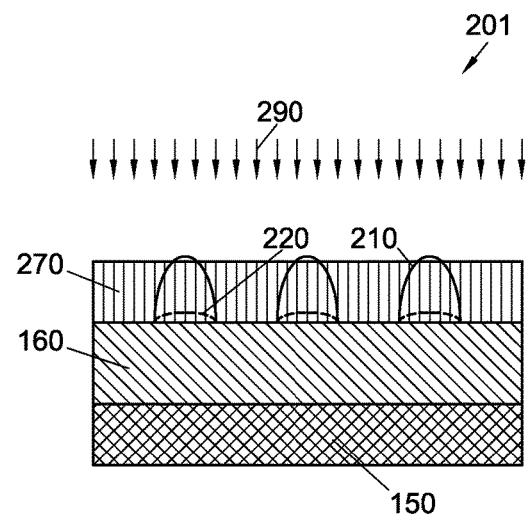
FIG. 1C  FIG. 1D

METROLOGY FOR MEASUREMENT OF PHOTOSENSITIZER CONCENTRATION WITHIN PHOTO-SENSITIZED CHEMICALLY-AMPLIFIED RESIST (PS-CAR)

CROSS REFERENCE TO RELATED APPLICATIONS

This application is based on and claims the benefit of and priority to co-pending U.S. Provisional Patent Application No. 61/944,050, entitled "METROLOGY CONCEPTS FOR MEASUREMENT OF PHOTOSENSITIZER CONCENTRATION WITHIN PS-CAR RESIST CREATED BY PRIMARY EXPOSURE FOR CONTROL OF SECONDARY EXPOSURE", filed on Feb. 24, 2014, the entire contents of which are herein incorporated by reference.

BACKGROUND OF THE INVENTION

Field of the Invention

The present invention relates to a method for patterning in semiconductor manufacturing. Specifically, it relates to metrology for patterning (lithography) that utilizes Photo-Sensitized Chemically-Amplified resist (PS-CAR).

Description of Related Art

In lithographic patterning of semiconductor devices, shrinking technology nodes, and thus feature sizes are driving wavelengths into the extreme ultraviolet (EUV) range. At this time, EUV light sources are still under active development, and currently are not capable of developing and delivering the levels of illumination of prior generations of light sources. To address these shortcomings and still be able to utilize the current generation of EUV light sources, a resist chemistry and associated methods have been developed, called Photo-Sensitized Chemically-Amplified resist (PS-CAR). PS-CAR, like traditional Chemically-Amplified resist (CAR), utilizes acid generated within the resist feature for deprotection, but acid is generated in a two-step illumination process, unlike CAR where only a single patterned exposure is used.

In PS-CAR, a first EUV patterned exposure is used to generate a pattern (latent image within the resist) with a relatively small amount of generated acid, and at the same time generate a photosensitizer (PS) compound, for example from a photosensitizer generator added to the PS-CAR resist. Both the acid and photosensitizer (PS) are generated only in illuminated portions of the PS-CAR resist, during the first EUV patterned exposure. Thereafter, a second flood exposure is performed, i.e. with no pattern, at a second wavelength of light different than the wavelength of the first EUV exposure. The PS-CAR resist chemistry is chosen such that the photosensitizer (PS) is sensitive to the second wavelength of light used in the second flood exposure, while other resist components are not. The photosensitizer (PS), wherever present in the pattern formed during the first EUV patterned exposure causes further generation of acid during the second flood exposure, with tenfold increases of acid concentration, for example, being typical. This photosensitizer-induced acid concentration increase results in greatly increased contrast, which allows more process latitude particularly with respect to the RLS tradeoff (Resolution-Line Width Roughness-Sensitivity). Thus, PS-CAR presents an enabling technology for EUV lithography because it allows the productive use of EUV sources and lithography at their present power levels.

It should be noted here that PS-CAR processes may involve additional steps, for example between the first EUV patterned exposure and the second flood exposure. The above description was simplified for purposes of clarity. Also, in some PS-CAR chemistry embodiments, no acid may be generated during the first EUV patterned exposure, and only photosensitizer (PS) may be generated, which generated photosensitizer (PS) causes generation of all acid during the second flood exposure. Alternatively yet, acid may be generated in small quantities, as explained before, but it may be effectively consumed by competing chemical reactions, such as quenching events (depending on the amount of quencher present in the PS-CAR resist).

Because of the importance of the distribution of photosensitizer (PS) concentration on the final outcome of the patterning process via its effect on acid generation and amplification, there exists a need to develop robust metrology and advanced process control (APC) methods that would be used to diagnose and control the PS-CAR patterning process. Specifically there exists a need for determination of concentrations and spatial concentration profiles of photosensitizer (PS), at various points during the patterning process, such that process adjustments can be made to compensate for deviations from the target processing outcome.

SUMMARY OF THE INVENTION

An aspect of the invention includes a method for treating a substrate, comprising: receiving the substrate, the substrate comprising: an underlying layer on the substrate, and a radiation-sensitive material layer on the underlying layer, the radiation-sensitive material layer comprising: a first light wavelength activation threshold that controls the generation of acid to a first acid concentration in the radiation-sensitive material layer and controls generation of photosensitizer (PS) molecules in the radiation-sensitive material layer; and a second light wavelength activation threshold that can excite the photosensitizer (PS) molecules in the radiation-sensitive material layer that results in the acid comprising a second acid concentration that is greater than the first acid concentration, the second light wavelength being different from the first light wavelength; exposing a first wavelength of light through a patterned mask onto the radiation-sensitive material layer, the first wavelength of light comprising a wavelength in the EUV spectrum; flood exposing a second wavelength of light to the radiation-sensitive material layer, the second wavelength of light comprising a wavelength that is different from the first wavelength of light; and in a metrology system, measuring the concentration of photosensitizer (PS) molecules in the radiation-sensitive material layer.

In various embodiments, the metrology system can either be an integrated metrology system within a photolithography track system or the metrology system can be a stand-alone metrology system. The metrology system may comprise an ellipsometer, spectroscopic ellipsometer, a reflectometer, a scatterometer, an atomic force microscope (AFM), or a Fourier Transform Infrared (FTIR) spectrometer configured to directly measure the concentration of photosensitizer molecules from acquired Fourier Transform Infrared (FTIR) spectra. In various embodiments, measurements can be made in a single location, or at multiple locations across the substrate.

Another aspect of the invention is that photosensitizer (PS) metrology can be performed prior to or after a second flood exposure of the radiation sensitive material, or both; or before or after any substrate heating (bake) process within the PS-CAR patterning process.

A further aspect of the invention involves the use of optical metrology techniques utilizing a correlation of an optical property of the radiation-sensitive material layer to the concentration of photosensitizer molecules, wherein the metrology system is configured to measure the selected optical property of the radiation-sensitive material layer and determine the concentration of photosensitizer molecules utilizing the correlation of the selected optical property of the radiation-sensitive material layer to the concentration of photosensitizer molecules. In various embodiments, the selected optical property may comprise a refractive index, a light absorption coefficient, or a thickness of the radiation-sensitive material layer.

Yet a further aspect involves communicating the measured concentration of photosensitizer molecules to a control unit capable of monitoring the photosensitizer concentration data and altering at least one process parameter of a photolithography or subsequent process; and altering at least one process parameter of a photolithography or subsequent process in response to the communicated photosensitizer concentration data. In various embodiments, the alteration of the at least one process parameter can be performed in a feedback manner or feedforward manner; and within a die, inter-die, within a substrate, or between substrate lots.

Yet another aspect of the invention includes a metrology target comprising: a radiation-sensitive material layer, the radiation-sensitive material layer comprising: a first light wavelength activation threshold that controls the generation of acid to a first acid concentration in the radiation-sensitive material layer and controls generation of photosensitizer molecules in the radiation-sensitive material layer; and a second light wavelength activation threshold that can excite the photosensitizer molecules in the radiation-sensitive material layer that results in the acid comprising a second acid concentration that is greater than the first acid concentration, the second light wavelength being different from the first light wavelength.

Yet a further aspect of the invention includes a substrate comprising the previously-described metrology targets, wherein the metrology targets can be formed within die or within the scribe lines of the substrate.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 1A and 1B show exemplary photosensitizer and acid concentration profiles, and a device cross section following an EUV patterned exposure step in a PS-CAR patterning process in accordance with an embodiment of the invention.

FIGS. 1C and 1D show exemplary photosensitizer and acid concentration profiles, and a device cross section following a flood exposure step in a PS-CAR patterning process in accordance with an embodiment of the invention.

DETAILED DESCRIPTION OF EXEMPLARY EMBODIMENTS

Figures 2, 3:
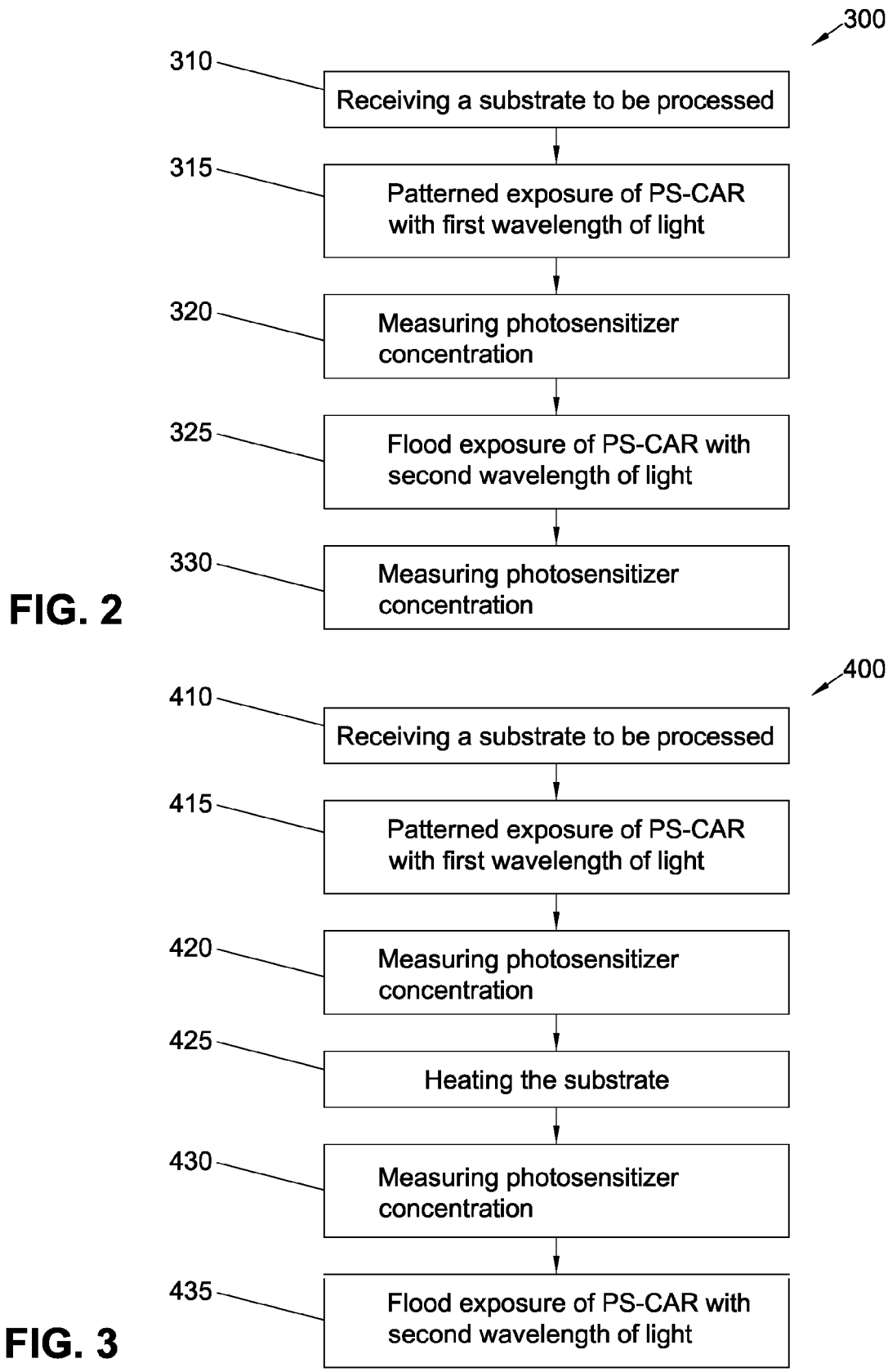
FIG. 2 shows an exemplary flowchart of a PS-CAR patterning process involving metrology steps in accordance with embodiments of the invention.
FIG. 3 shows an exemplary flowchart of another PS-CAR patterning process involving metrology steps in accordance with embodiments of the invention.

Embodiments of the present invention relate to design and control of a process, apparatus, and system for patterning a layer on a substrate, in semiconductor manufacturing.

In the following description, in order to facilitate a thorough understanding of the invention and for purposes of explanation and not limitation, specific details are set forth, such as particular geometries of a lithography, coater/developer, exposure tools, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Furthermore, the use of photo-sensitized chemically-amplified resist (PS-CAR) is not limited only to resist (photoresist), but similar light-sensitive chemistries can be implemented in antireflective coatings (ARC), bottom antireflective coatings (BARC), developer-soluble bottom antireflective coatings (DBARC), etc. It is understood that the PS-CAR chemistries and methods described herein may be applied to all these materials and patterning thereof, and therefore the terms resist, photoresist, and radiation-sensitive material will be used interchangeably hereinafter to refer to all of these materials.

The photo-sensitized chemically-amplified resist (PS-CAR) concept is currently being proposed, for example, by S. Tagawa et al., "Super High Sensitivity Enhancement by Photo-Sensitized Chemically Amplified Resist Process", Journal of Photopolymer Science and Technology, Vol. 26, Number 6 (2013), pp. 825-830 (Tagawa hereinafter). In contrast to traditional resist processing wherein a single patterned exposure (i.e. through a mask) generates regions of de-protected (positive-tone) or protected (negative-tone) resist that define soluble and insoluble regions, respectively, PS-CAR processing relies on a first patterned exposure at a first wavelength of light to amplify sensitivity of the resist to a second chemically-selective flood exposure at a second wavelength of light, which defines the final pattern. The second wavelength of light is chosen to be different than the first wavelength of light. This enables higher sensitivity patterning when photon density is low. The photosensitizer (PS) is created during the first EUV patterned exposure, and only in exposed regions of the resist. Electron beam (eBeam), KrF, or ArF exposure can also be used for the first patterned exposure.

The choice of flood exposure wavelength is dictated by the requirement that the absorption by the photosensitizer (PS) be maximized while minimizing the absorbance by the photo acid generator (PAG) in the resist. Typically, the flood exposure wavelength of light is in the UV portion of the light spectrum. The photosensitizer (PS) excited by the second flood exposure will decompose photoacid generator (PAG) molecules in its vicinity causing amplification of acid generation in regions that were exposed in the first EUV patterned exposure, while essentially maintaining no acid formation in unexposed regions. This means there is no DC-bias shift that is typically present in traditional flood exposure processes.

The resist thus may include a separate activation thresholds that enables the generation of chemicals within the resist to occur at different times under different process conditions, prior to being developed. Specifically, the concept is to isolate the generation of photosensitizer (PS) and acid amplification from one another, within the resist, as described in Tagawa. In some PS-CAR chemistry embodiments, only the photosensitizer and no acid are generated during the first EUV patterned exposure, the acid generation and amplification occurring entirely during the subsequent second flood exposure. In these embodiments, there is no overlap in the light sensitivity ranges of the photosensitizer generator and the photoacid generator (PAG). In other PS-CAR chemistry embodiments, the photosensitizer generator and photoacid generator (PAG) light sensitivity ranges may overlap slightly, such that photosensitizer (PS) is generated concurrently with a relatively small amount of acid, typically less than about half of the final amount of generated acid after amplification, during the first EUV patterned exposure. This initially generated amount of acid is then amplified in the second flood exposure. In exemplary embodiments of PS-CAR, the first (EUV) wavelength of light may be less than 300 nm while the second wavelength of light used for second flood exposure may be greater than 300 nm, typically about 365 nm.

In an embodiment, the resist may include a photosensitizer generator comprising a first light wavelength activation threshold that controls generation of photosensitizer (PS) molecules in the resist layer and a photoacid generation (PAG) compound comprising a second light wavelength activation threshold that controls the generation and amplification of acid in the resist layer, wherein the second activation wavelength is different than the first activation wavelength, as mentioned before. The photosensitizer molecule may be chosen to absorb light energy and transfer the light energy to another molecule, for example a photoacid generator (PAG). Some photosensitizer (PS) molecules may transfer energy in a ground state while other may transfer energy in an excited state. In an embodiment, the photosensitizer generator of PS-CAR resist may comprise at least one of acetophenone, triphenylene, benzophenone, flourenone, anthraquinone, phenanthrene, or derivatives thereof. In an embodiment, the photoacid generator (PAG) may be a cationic photoinitiator that may convert absorbed light energy into chemical energy, for example an acidic reaction. The photoacid generator (PAG) may comprise at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

To further assist understanding, FIGS. 1A-D describe the PS-CAR patterning process prior to subsequent development and etching steps. In FIG. 1B, a substrate 150 is provided that is coated or modified to form an underlying layer 160, which is to be patterned. A PS-CAR resist 170 is applied using, for example, spin-on dispense techniques, to the exposed surface of the underlying layer 160. In the first EUV patterned exposure 101, a first wavelength of light 190 is exposed onto the PS-CAR resist 170 through a mask 180, to form alternating exposed and unexposed regions inside PS-CAR resist 170. During this exposure, photosensitizer (PS) is generated from the photosensitizer generator in exposed regions of the PS-CAR resist 170, to form photosensitizer (PS) concentration profiles 120, which are also shown enlarged in FIG. 1A with graphs 100 of photosensitizer (PS) and acid concentration profiles, 120 and 110, respectively. Depending on the PS-CAR resist chemistry, in some embodiments, acid may also be formed during first EUV patterned exposure 101 from photoacid generators (PAG) molecules inside PS-CAR resist 170, to form acid concentration profiles 110. In other embodiments, where there is no overlap between photosensitizer generator and photoacid generator (PAG) light sensitivity ranges, as described before, no acid is generated during the first EUV patterned exposure 101.

Subsequently, as shown in FIG. 1D, the substrate 150, with underlying layer 160 and pattern-exposed PS-CAR resist 170 is now subjected to a second flood exposure 201 using a second wavelength of light 290 different than the first wavelength of light 190, where the second flood exposure causes photosensitizer (PS) molecules generated in previously exposed (i.e. unmasked) regions to amplify acid generation from photoacid generator (PAG) molecules in their vicinity, thereby forming acid concentration profiles 210. Acid concentration profiles 210 have higher peaks and therefore a better contrast than acid concentration profiles 110 following the first EUV patterned exposure 101. Even though a second flood exposure 201 is involved, unlike in traditional flood exposure processing there is no generation of acid in regions that were unexposed (masked) during the first EUV patterned exposure 101, thus there is no DC-bias and a high contrast is maintained. This is because in PS-CAR acid generation and amplification occur only in the presence of photosensitizer (PS). Typically, photosensitizer (PS) concentration profiles 220 undergo little change after second flood exposure 201 from initial photosensitizer (PS) concentration profiles 120, but in certain chemistry embodiments, larger changes may occur between photosensitizer (PS) concentration profiles 120 and 220. FIG. 1C shows graphs 200 of photosensitizer (PS) and acid concentration profiles, 220 and 210, respectively, following the second flood exposure 201.

With the amplified acid concentration profiles 210 now present in the PS-CAR resist 170, forming a latent image, the substrate is now ready for subsequent patterning process steps, such as bakes, development, and etching of the underlying layer 160, to complete the patterning process following traditional steps. In some embodiments, additional processing steps may be made between the first EUV patterned exposure 101 and second flood exposure 201, such as baking steps, etc. Furthermore, while the process is described herein using PS-CAR resist 170 as an example, the same process is applicable to any other materials such as ARC, BARC, DBARC, etc. layers including a PS-CAR chemistry.

FIGS. 1A-D and the foregoing discussion show how critical the photosensitizer (PS) concentration profile is to the final acid concentration profile, which in turn determines the contrast, and ultimately the development and subsequent etch process outcomes. To be able to control these patterning process steps the inventors have found it to be advantageous to employ metrology to monitor the photosensitizer (PS) concentration in the latent image at various points during the patterning process, so that these measurements can be used to alter patterning process variables in response to the measurements.

FIG. 2 shows an embodiment of such a PS-CAR patterning process 300, wherein metrology steps are inserted prior to the second flood exposure and after the second flood exposure, or both, to monitor the photosensitizer (PS) concentration in the PS-CAR resist. In step 310, a substrate is provided, such as substrate 150 with underlying layer 160 to be patterned formed thereupon, and a PS-CAR resist 170 deposited atop the underlying layer 160. In step 315, the PS-CAR resist is subjected to a first EUV patterned exposure using a first wavelength of light, typically in the EUV range, thus activating the first activation threshold to generate photosensitizer (PS) from photosensitizer generator present in the PS-CAR resist 170. In step 325, the PS-CAR resist 170 is subjected to a second flood exposure at a second wavelength of light different than the first wavelength of light, to activate a second activation threshold and cause generation and amplification of acid from photoacid generator (PAG) molecules in the PS-CAR resist 170, to generate a final acid concentration profile, as explained before.

In the exemplary process flow of patterning process 300, a first metrology step 320 may be inserted after the first EUV patterned exposure step 315 and prior to the second flood exposure step 325, to measure the concentration of photosensitizer (PS) generated during the first EUV patterned exposure. Measuring the photosensitizer (PS) concentration at this point allows one to determine the effects of, for example, defocus and/or other systemic error-inducing effects from the exposure tool/scanner, or of EUV shot noise effects associated with the first EUV patterned exposure. The reasons for performing photosensitizer (PS) concentration metrology are certainly not limited to the aforementioned reasons only. Alternatively, or in addition to metrology step 320, the photosensitizer (PS) concentration may also be measured in metrology step 330, immediately following the second flood exposure step 325.

In practice, heating or baking steps may be inserted into the patterning process 300. For example, to mitigate EUV shot noise effects of the first EUV patterned exposure, a heating step may be utilized between the first EUV patterned exposure and the second flood exposure, to diffuse the generated photosensitizer (PS) and smooth the photosensitizer (PS) concentration profile affected by EUV shot noise. An example of one such patterning process 400 is shown in FIG. 3, wherein the process commences at step 410, in which a substrate is provided, such as substrate 150 with underlying layer 160 to be patterned formed thereupon, and a PS-CAR resist 170 deposited atop the underlying layer 160. In step 415, the PS-CAR resist is subjected to a first EUV patterned exposure using a first wavelength of light, typically in the EUV range, thus activating the first activation threshold to generate photosensitizer (PS) from photosensitizer generator present in the PS-CAR resist 170. In step 425, the substrate is heated (baked), for example to mitigate effects of EUV shot noise. In step 435, the PS-CAR resist 170 is subjected to a second flood exposure at a second wavelength of light different than the first wavelength of light, to activate a second activation threshold and cause generation and amplification of acid from photoacid generator (PAG) molecules in the PS-CAR resist 170, to generate a final acid concentration profile, as explained before.

In the exemplary process flow of patterning process 400, a first metrology step 420 may be inserted after the first EUV patterned exposure step 315 and prior to the heating step 425, to measure the concentration of photosensitizer (PS) generated during the first EUV patterned exposure. Measuring the photosensitizer (PS) concentration at this point allows one to determine the effects of the EUV patterned exposure itself on photosensitizer (PS) concentration, such as for example, EUV shot noise effects, or effects of defocus and other systemic error-inducing effects associated with the exposure tool/scanner, as mentioned before. Alternatively, or in addition to metrology step 420, the photosensitizer (PS) concentration may also be measured in metrology step 430, immediately following the heating step 425, for example to measure the effects of photosensitizer (PS) diffusion during heating step 425.

It should be noted here that the specific order of steps outlined in patterning processes 300 and 400 of FIGS. 2 and 3, respectively, may be different. Specifically, in patterning process 400, the substrate heating step 425 may occur after the second flood exposure of step 435, for example where the heating step 425 comprises a traditional post-exposure bake (not shown). In such a case, metrology steps 420 and 430 can also be moved in the process flow to occur just before and after the heating step 425, and would therefore both occur after the second flood exposure step 435.

Figure 4:
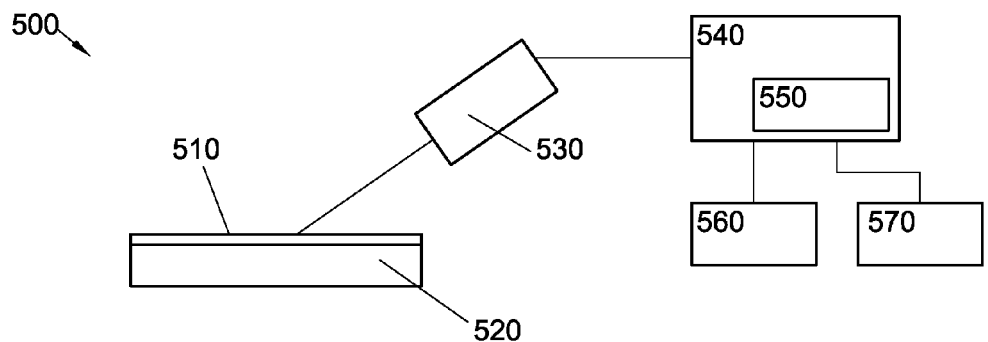
FIG. 4 shows a schematic of a metrology system for measuring photosensitizer concentration and control unit in accordance with embodiments of the invention.

FIG. 4 shows a schematic of an exemplary embodiment of metrology system 500, used to measure photosensitizer (PS) concentration, in accordance with an embodiment of the invention. Metrology system 500 may be integrated within a photolithographic track tool or an exposure tool (patterned or flood), or it may be part of a standalone kiosk-type metrology tools. In the former, each substrate being processed can be inspected using the integrated metrology system 500, while the latter setup may be better suited for situations where only a sampling of the total number of processed substrates is diagnosed.

Metrology system 500 may comprise a substrate holder 520 atop which substrate 510 can be mounted while being diagnosed. Metrology device 530 is used to make the actual measurements on substrate 510.

In an embodiment, metrology device 530 may be capable of measuring the photosensitizer (PS) concentration directly, for example if the metrology device 530 comprises a Fourier Transform Infrared (FTIR) sensor capable of directly measuring FTIR spectra and determining the photosensitizer (PS) concentration from these spectral measurements. Because FTIR can detect chemistry changes and because of its very high sensitivity, it is uniquely suited for diagnosing the initial generation of photosensitizer (PS) from a photosensitizer generator, as occurs during the first EUV patterned exposure, for example in metrology step 320 of patterning process 300, or metrology step 420 of patterning process 400, respectively.

In other embodiments, photosensitizer (PS) concentration can be measured indirectly, opening possibilities for utilizing less expensive and/or less sensitive diagnostics than FTIR, where appropriate. One possibility for utilizing less expensive diagnostics relies on the fact that there is a small but measurable change of PS-CAR resist thickness associated with the photoacid generator (PAG) decomposition during the first EUV patterned exposure. Because generation of photosensitizer (PS) from photosensitizer generator molecules occurs concurrent with this process, a relationship may be set up using experiments or simulations that correlates the change of thickness of PS-CAR resist to the concentration of photosensitizer (PS) within the PS-CAR resist. Such a correlation may be established experimentally using design of experiments (DOE) techniques by performing experiments in which both the thickness change and photosensitizer (PS) concentration are measured directly, and such a correlation may be stored as a lookup table or library to allow subsequent direct conversion of PS-CAR resist thickness change measurements into corresponding photosensitizer (PS) concentration measurements. It is important to note that the thickness change manifests itself in different ways for different device feature types. For example, if a feature is a simple pad, or dedicated metrology target including a pad, the thickness change occurs uniformly across the entire surface of the pad. However, if the feature is an undeveloped dense line-space pattern, the thickness change manifests itself in a sinusoidal thickness variation of the PS-CAR resist. Therefore, when experiments or simulations are performed to set up correlations of PS-CAR resist thickness to the photosensitizer (PS) concentration, feature types need to be taken into account. In the case of dense line-space patterns, a correlation can be further made of the sinusoidal thickness variation to the total thickness change, such that measurements of the sinusoidal variation of thickness can be employed to determine photosensitizer (PS) concentration through a two-step correlation process.

With reference now again to FIG. 4, metrology device 530 can include any metrology device capable of measuring thickness of PS-CAR resist thickness. In an embodiment, a noncontact Atomic Force Microscope (AFM) may be utilized as metrology device 530 to measure the PS-CAR resist thickness. The AFM may be operated in tapping mode to interact with a metrology target formed on substrate 510. The AFM tip can interact with either a large pad formed as part of the metrology target, or it can interact with a line-space pattern formed as part of the metrology target. AFM measurements communicated from metrology device 530 to control unit 540 are then readily converted into photosensitizer (PS) concentration data using correlations stored in library 550 which may be a part of control unit 540.

In other embodiments, an optical metrology device such as a reflectometer, scatterometer, ellipsometer, spectroscopic ellipsometer, etc., may be used as metrology device 530 to measure the PS-CAR resist thickness and communicate measurements to control unit 540. The illumination beam of an optical metrology device can be configured to interact with a large pad formed as part of the metrology target, or it can interact with a line-space pattern formed as part of the metrology target, wherein the line-space pattern forms an optical grating structure. Methods of measuring film thickness and optical grating structures by scatterometry, reflectometry, and ellipsometry are well known to persons skilled in the art of optical metrology. Once thickness measurements are communicated to control unit 540, they can be converted into photosensitizer (PS) concentration measurements as in the foregoing discussion.

In yet further embodiments, a reflectometer, scatterometer, ellipsometer, or spectroscopic ellipsometer used as metrology device 530 may be used to more directly measure photosensitizer (PS) concentration by measuring the change of other optical properties of the PS-CAR resist, such as the refractive index (e.g. real and imaginary parts, n and k, thereof), light absorption coefficient, light extinction coefficient, etc. In these embodiments, design of experiments (DOE) techniques can be used to establish correlations of these measured optical properties of the PS-CAR resist to the measured photosensitizer (PS) concentration, which correlations may be stored in library 550 to facilitate conversion of measured optical properties into photosensitizer (PS) concentration.

Once photosensitizer (PS) concentration measurements are made and available in control unit 540, they can be employed for feedback and feedforward control of the patterning process itself or for control of subsequent process steps that are affected by the outcome of the patterning process, for example subsequent etch process steps. The feedback and feedforward control can be achieved by altering a processing parameter of the patterning process or subsequent process by communicating an alteration of a processing parameter to the processing tool controller 560 which commands the processing tool, e.g. a photolithographic track tool, to alter a patterning process parameter in response to the photosensitizer (PS) concentration measurements. Alternatively or in addition to that, a processing parameter alteration may be communicated to fab controller 570, from which the alteration of a process parameter will be further communicated to another processing tool, e.g. an etch tool that is to execute a subsequent processing step, e.g. an etch process.

Such process parameter alterations may be effected by control unit 540 in a feedforward and feedback manner, and can be made within a die, inter-die, within a substrate, or between substrate lots. For example, process parameter alterations may be made to compensate for deviations in any PS-CAR patterning process step, such as the heating step, second flood exposure step, post-exposure bake step, development step, etc. for better critical dimension control.

Figure 5:
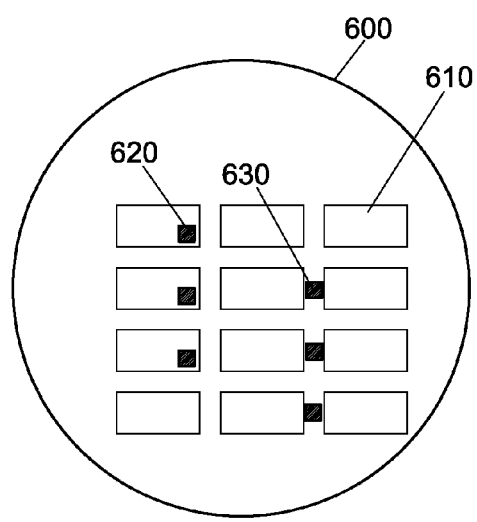
FIG. 5 shows a schematic of a substrate with PS-CAR metrology targets forms in-die and within scribe lines, in accordance with embodiments of the invention.

In an embodiment, a substrate 600 is provided, as shown in FIG. 5, wherein a plurality of metrology targets 620 and 630 are formed in the PS-CAR resist layer formed atop substrate 600. Metrology targets 620 may be formed within die 610 formed on substrate 600, while metrology targets 630 may be formed within the scribe lines between the die 610. Photosensitizer (PS) concentration measurements can thus be made across a plurality of locations on substrate 600, for example to provide useful information about the uniformity of the patterning process.

Figure 6:
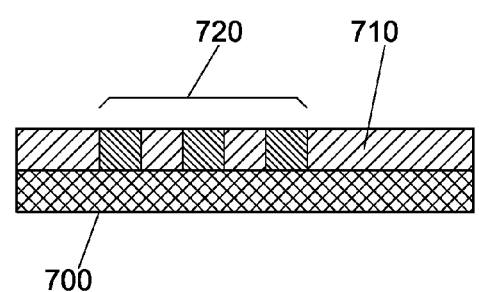
FIG. 6 shows a cross-sectional schematic of a single PS-CAR metrology target in accordance with embodiments of the invention.

An embodiment of each metrology target 620 or 630 is shown in FIG. 6, where a PS-CAR resist layer 710 is formed atop substrate 700. Embedded within the PS-CAR resist layer 710 can be a metrology target 720 comprising a line-space pattern forming an optical grating structure suitable for optical diagnostics as mentioned in the foregoing discussion. Alternatively, the metrology target 720 may simply comprise a pad (not shown) formed in the PS-CAR resist later 710. In other embodiments, the metrology target 720 may comprise a more complex pattern as dictated by requirements of the optical metrology method that is used, to improve measurement accuracy, repeatability, eliminate systematic error sources, etc., the design of such more complex metrology target being well known to those skilled in the art of optical metrology.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for treating a substrate, comprising:
   receiving the substrate, the substrate comprising:
     an underlying layer on the substrate, and
     a radiation-sensitive material layer on the underlying layer, the radiation-sensitive material layer comprising:
       a first light wavelength activation threshold that controls the generation of acid to a first acid concentration in the radiation-sensitive material layer and controls generation of photosensitizer molecules in the radiation-sensitive material layer; and
       a second light wavelength activation threshold that can excite the photosensitizer molecules in the radiation-sensitive material layer that results in the acid comprising a second acid concentration that is greater than the first acid concentration, the second light wavelength being different from the first light wavelength;
   exposing a first wavelength of light through a patterned mask onto the radiation-sensitive material layer, the first wavelength of light comprising a wavelength in the EUV spectrum;
   flood exposing a second wavelength of light to the radiation-sensitive material layer, the second wavelength of light comprising a wavelength that is different from the first wavelength of light; and
   in a metrology system, measuring the concentration of photosensitizer molecules in the radiation-sensitive material layer.

2. The method of claim 1, wherein the metrology system is integrated within a photolithography track system or the metrology system is a standalone metrology system.

3. The method of claim 1, wherein the metrology system comprises an ellipsometer, spectroscopic ellipsometer, a reflectometer, a scatterometer, an atomic force microscope (AFM), or a Fourier Transform Infrared (FTIR) spectrometer configured to directly measure the concentration of photosensitizer molecules from acquired Fourier Transform Infrared (FTIR) spectra.

4. The method of claim 3, wherein the Fourier Transform Infrared (FTIR) spectrometer is configured to directly measure the concentration of photosensitizer molecules from acquired Fourier Transform Infrared (FTIR) spectra.

5. The method of claim 1, wherein the step of measuring the concentration of photosensitizer molecules occurs after the step of exposing a first wavelength of light through a patterned mask, and prior to the step of flood exposing a second wavelength of light.

6. The method of claim 1, further comprising:
   heating the substrate after the step of exposing a first wavelength of light through a patterned mask, and prior to the step of flood exposing a second wavelength of light.

7. The method of claim 6, wherein the step of measuring the concentration of photosensitizer molecules occurs after the step of exposing a first wavelength of light through a patterned mask, and prior to the step of heating the substrate.

8. The method of claim 6, wherein the step of measuring the concentration of photosensitizer molecules occurs after the step of heating the substrate, and prior to the step of flood exposing a second wavelength of light.

9. The method of claim 1, further comprising:
   correlating a selected optical property of the radiation-sensitive material layer to the concentration of photosensitizer molecules,
   wherein the metrology system is configured to measure the selected optical property of the radiation-sensitive material layer and determine the concentration of photosensitizer molecules utilizing the correlation of the selected optical property of the radiation-sensitive material layer to the concentration of photosensitizer molecules.

10. The method of claim 9, wherein the selected optical property comprises a refractive index, a light absorption coefficient, or a thickness of the radiation-sensitive material layer.

11. The method of claim 9, wherein the metrology system is configured to measure the selected optical property of the radiation-sensitive material layer at a plurality of locations, to construct an optical property profile of the radiation-sensitive material layer, and measure the concentration profile of photosensitizer molecules, therefrom.

12. The method of claim 9, wherein the step of correlating the selected optical property of the radiation-sensitive material layer to the concentration of photosensitizer molecules comprises creation of a library.

13. The method of claim 1, further comprising:
   communicating the measured concentration of photosensitizer molecules to a control unit capable of monitoring the photosensitizer concentration data and altering at least one process parameter of a photolithography or subsequent process; and
   altering at least one process parameter of a photolithography or subsequent process in response to the communicated photosensitizer concentration data.

14. The method of claim 13, wherein the alteration of the at least one process parameters is performed in a feedback manner or feedforward manner.

15. The method of claim 13, wherein the at least one process parameter comprises a parameter of a flood exposure process, a bake process, a development process, an exposure process, or a subsequent etch process.

16. The method of claim 13, wherein the alteration of the at least one process parameter is performed within a die, inter-die, within a substrate, or between substrate lots.

17. A metrology target, comprising:
   a radiation-sensitive material layer, the radiation-sensitive material layer comprising:
     a first light wavelength activation threshold that controls the generation of acid to a first acid concentration in the radiation-sensitive material layer and controls generation of photosensitizer molecules in the radiation-sensitive material layer; and a second light wavelength activation threshold that can excite the photosensitizer molecules in the radiation-sensitive material layer that results in the acid comprising a second acid concentration that is greater than the first acid concentration, the second light wavelength being different from the first light wavelength.

18. A substrate, comprising:

a plurality of die formed thereon, the die separated by a plurality of scribe lines; and at least one metrology target comprising:

a radiation-sensitive material layer, the radiation-sensitive material layer comprising:

a first light wavelength activation threshold that controls the generation of acid to a first acid concentration in the radiation-sensitive material layer and controls generation of photosensitizer molecules in the radiation-sensitive material layer; and a second light wavelength activation threshold that can excite the photosensitizer molecules in the radiation-sensitive material layer that results in the acid comprising a second acid concentration that is greater than the first acid concentration, the second light wavelength being different from the first light wavelength.

19. The substrate of claim 18, wherein the metrology target is formed within a die or within a scribe line.

20. A method for treating a substrate, comprising:

providing the substrate with a plurality of die formed thereon, the die separated by a plurality of scribe lines; and forming a metrology target on the substrate, the metrology target comprising:

a radiation-sensitive material layer, the radiation-sensitive material layer comprising:

a first light wavelength activation threshold that controls the generation of acid to a first acid concentration in the radiation-sensitive material layer and controls generation of photosensitizer molecules in the radiation-sensitive material layer; and a second light wavelength activation threshold that can excite the photosensitizer molecules in the radiation-sensitive material layer that results in the acid comprising a second acid concentration that is greater than the first acid concentration, the second light wavelength being different from the first light wavelength, wherein the metrology target is formed within a die or within a scribe line.

* * * * *